(12) United States Patent
Ho et al.

(10) Patent No.: US 8,105,956 B2
(45) Date of Patent: Jan. 31, 2012

(54) METHODS OF FORMING SILICON OXIDES AND METHODS OF FORMING INTERLEVEL DIELECTRICS

(75) Inventors: Yunjun Ho, Boise, ID (US); Brent Gilgen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 116 days.

(21) Appl. No.: 12/582,181

(22) Filed: Oct. 20, 2009

(65) Prior Publication Data

US 2011/0092061 A1    Apr. 21, 2011

(51) Int. Cl.
*H01L 21/31* (2006.01)

(52) U.S. Cl. ........ 438/763; 438/587; 438/787; 438/791; 257/E21.191; 257/E21.282

(58) Field of Classification Search ........... 257/E21.176, 257/E21.191, E21.282, E21.302, E21.532
See application file for complete search history.

(56) References Cited

U.S. PATENT DOCUMENTS

| | | |
|---|---|---|
| 3,809,574 A | 5/1974 | Duffy et al. |
| 3,990,927 A | 11/1976 | Montier |
| 4,474,975 A | 10/1984 | Clemons et al. |
| 4,836,885 A | 6/1989 | Breiten et al. |
| 4,871,689 A | 10/1989 | Bergami et al. |
| 5,105,253 A | 4/1992 | Pollock |
| 5,116,771 A | 5/1992 | Karulkar |
| 5,156,881 A | 10/1992 | Okano et al. |
| 5,182,221 A | 1/1993 | Sato |
| 5,387,539 A | 2/1995 | Yang et al. |
| 5,410,176 A | 4/1995 | Liou et al. |
| 5,470,798 A | 11/1995 | Ouellet |
| 5,492,858 A | 2/1996 | Bose et al. |
| 5,516,721 A | 5/1996 | Galli et al. |
| 5,518,959 A | 5/1996 | Jang et al. |
| 5,565,376 A | 10/1996 | Lur et al. |
| 5,604,149 A | 2/1997 | Paoli et al. |
| 5,616,513 A | 4/1997 | Shepard |
| 5,702,976 A | 12/1997 | Schuegraf et al. |
| 5,702,977 A | 12/1997 | Jang et al. |
| 5,719,085 A | 2/1998 | Moon et al. |
| 5,741,740 A | 4/1998 | Jang et al. |
| 5,770,469 A | 6/1998 | Uram et al. |
| 5,776,557 A | 7/1998 | Okano et al. |
| 5,786,039 A | 7/1998 | Brouquet |

(Continued)

FOREIGN PATENT DOCUMENTS

EP    0817251    1/1998

(Continued)

OTHER PUBLICATIONS

WO PCT/US2004/021156, published Jun. 30, 2004, IPER.

(Continued)

*Primary Examiner* — Cheung Lee
(74) *Attorney, Agent, or Firm* — Wells St. John P.S.

(57) ABSTRACT

A method of forming silicon oxide includes depositing a silicon nitride-comprising material over a substrate. The silicon nitride-comprising material has an elevationally outermost silicon nitride-comprising surface. Such surface is treated with a fluid that is at least 99.5% $H_2O$ by volume. A polysilazane-comprising spin-on dielectric material is formed onto the $H_2O$-treated silicon nitride-comprising surface. The polysilazane-comprising spin-on dielectric material is oxidized to form silicon oxide. Other implementations are contemplated.

36 Claims, 12 Drawing Sheets

U.S. PATENT DOCUMENTS

| | | | |
|---|---|---|---|
| 5,786,263 A | 7/1998 | Perera |
| 5,801,083 A | 9/1998 | Yu et al. |
| 5,863,827 A | 1/1999 | Joyner |
| 5,883,006 A | 3/1999 | Iba |
| 5,888,880 A | 3/1999 | Gardner et al. |
| 5,895,253 A | 4/1999 | Akram |
| 5,895,255 A | 4/1999 | Tsuchiaki |
| 5,904,540 A | 5/1999 | Sheng et al. |
| 5,923,073 A | 7/1999 | Aoki et al. |
| 5,930,645 A | 7/1999 | Lyons et al. |
| 5,930,646 A | 7/1999 | Gerung et al. |
| 5,943,585 A | 8/1999 | May et al. |
| 5,950,094 A | 9/1999 | Lin et al. |
| 5,960,299 A | 9/1999 | Yew et al. |
| 5,972,773 A | 10/1999 | Liu et al. |
| 5,976,949 A | 11/1999 | Chen |
| 5,981,354 A | 11/1999 | Spikes et al. |
| 5,989,978 A | 11/1999 | Peidous |
| 5,998,280 A | 12/1999 | Bergemont et al. |
| 6,013,583 A | 1/2000 | Ajmera et al. |
| 6,030,881 A | 2/2000 | Papasouliotis et al. |
| 6,033,961 A | 3/2000 | Xu et al. |
| 6,051,477 A | 4/2000 | Nam |
| 6,069,055 A | 5/2000 | Ukeda et al. |
| 6,090,675 A | 7/2000 | Lee et al. |
| 6,127,737 A | 10/2000 | Kuroi et al. |
| 6,156,674 A | 12/2000 | Li et al. |
| 6,171,962 B1 | 1/2001 | Karlsson et al. |
| 6,187,651 B1 | 2/2001 | Oh |
| 6,190,979 B1 | 2/2001 | Radens et al. |
| 6,191,002 B1 | 2/2001 | Koyanagi |
| 6,245,641 B1 | 6/2001 | Shiozawa et al. |
| 6,265,282 B1 | 7/2001 | Lane et al. |
| 6,300,219 B1 | 10/2001 | Doan et al. |
| 6,326,282 B1 | 12/2001 | Park et al. |
| 6,329,266 B1 | 12/2001 | Hwang et al. |
| 6,331,380 B1 | 12/2001 | Ye et al. |
| 6,337,255 B1 | 1/2002 | Bradl et al. |
| 6,355,966 B1 | 3/2002 | Trivedi |
| 6,448,150 B1 | 9/2002 | Tsai et al. |
| 6,455,394 B1 | 9/2002 | Iyer et al. |
| 6,524,912 B1 | 2/2003 | Yang et al. |
| 6,534,395 B2 | 3/2003 | Werkhoven et al. |
| 6,583,028 B2 | 6/2003 | Doan et al. |
| 6,583,060 B2 | 6/2003 | Trivedi |
| 6,607,959 B2 | 8/2003 | Lee et al. |
| 6,617,251 B1 | 9/2003 | Kamath et al. |
| 6,674,132 B2 | 1/2004 | Willer |
| 6,719,012 B2 | 4/2004 | Doan et al. |
| 6,756,654 B2 | 6/2004 | Heo et al. |
| 6,759,298 B2 | 7/2004 | Lindsay et al. |
| 6,821,865 B2 | 11/2004 | Wise et al. |
| 6,869,860 B2 | 3/2005 | Beyansky et al. |
| 6,890,833 B2 | 5/2005 | Belyansky et al. |
| 6,930,058 B2 | 8/2005 | Hill et al. |
| 6,933,206 B2 | 8/2005 | Beintner et al. |
| 6,933,225 B2 | 8/2005 | Werkhoven et al. |
| 6,974,991 B2 | 12/2005 | Cheng et al. |
| 7,033,909 B2 | 4/2006 | Kim et al. |
| 7,049,661 B2 | 5/2006 | Yamada et al. |
| 7,053,010 B2 | 5/2006 | Li et al. |
| 7,125,815 B2 | 10/2006 | Vaartstra |
| 7,141,278 B2 | 11/2006 | Koh et al. |
| 7,157,385 B2 | 1/2007 | Derderian et al. |
| 7,160,787 B2 | 1/2007 | Heo et al. |
| 7,235,459 B2 | 6/2007 | Sandhu |
| 7,368,800 B2 | 5/2008 | Sandhu |
| 7,538,047 B2 * | 5/2009 | Kawasaki et al. ............. 438/787 |
| 2001/0006255 A1 | 7/2001 | Kwon et al. |
| 2001/0006839 A1 | 7/2001 | Yeo |
| 2001/0041250 A1 | 11/2001 | Haukka et al. |
| 2001/0046753 A1 | 11/2001 | Gonzales et al. |
| 2002/0000195 A1 | 1/2002 | Bang et al. |
| 2002/0004284 A1 | 1/2002 | Chen |
| 2002/0018849 A1 | 2/2002 | George et al. |
| 2003/0032281 A1 | 2/2003 | Werkhoven et al. |
| 2003/0038111 A1 | 2/2003 | Carducci et al. |
| 2003/0129826 A1 | 7/2003 | Werkhoven et al. |
| 2004/0016987 A1 | 1/2004 | Sawada et al. |
| 2004/0032006 A1 | 2/2004 | Yun et al. |
| 2004/0082181 A1 | 4/2004 | Doan et al. |
| 2004/0144749 A1 | 7/2004 | Kim et al. |
| 2004/0209484 A1 | 10/2004 | Hill et al. |
| 2004/0248374 A1 | 12/2004 | Belyansky et al. |
| 2004/0266153 A1 | 12/2004 | Hu |
| 2005/0009293 A1 | 1/2005 | Kim et al. |
| 2005/0009368 A1 | 1/2005 | Vaartstra |
| 2005/0054213 A1 | 3/2005 | Derderian et al. |
| 2005/0079730 A1 | 4/2005 | Beintner et al. |
| 2005/0112282 A1 | 5/2005 | Gordon et al. |
| 2005/0124171 A1 | 6/2005 | Vaartstra |
| 2005/0136684 A1 | 6/2005 | Mukai et al. |
| 2005/0142799 A1 | 6/2005 | Seo |
| 2005/0170608 A1 | 8/2005 | Kiyotoshi et al. |
| 2005/0179112 A1 | 8/2005 | Belyansky et al. |
| 2006/0128139 A1 | 6/2006 | Paranjpe et al. |
| 2006/0189159 A1 | 8/2006 | Derderian et al. |
| 2006/0216906 A1 | 9/2006 | Smythe et al. |
| 2007/0281498 A1 | 12/2007 | Lee et al. |

FOREIGN PATENT DOCUMENTS

| | | |
|---|---|---|
| EP | 0959493 | 11/1999 |
| JP | 02-277253 | 11/1990 |
| JP | 05-315441 | 11/1993 |
| JP | 06-334031 | 12/1994 |
| JP | 146224 | 1/1996 |
| JP | 9325675 | 12/1997 |
| WO | WO 02/27063 | 4/2002 |

OTHER PUBLICATIONS

WO PCT/US2004/021156, published Jun. 30, 2004, Written Opinion.

WO PCT/US2004/021156, published Jun. 30, 2004, Search Report.

Anonymous 32246, "Substrate Contact with Closed Bottom Trenches", Research Disclosure; 1 page, Feb. 1991.

Beekmann et al., "Sub-micron Gap fill and in-situ planarization using flowfillTM Technology", Electrotech 1-7, ULSI Conference, Portland, OR, Oct. 1995.

Chen et al., "Excimer Laser-Induced Ti Silicidation to Eliminate the Fine-Line Effect for Integrated Circuitry Device Fabrication", 149 Journal of Electrochemical Society, No. 11, pp. G609-G612, 2002.

Curtis et al., "APCVD TEOS: O3 Advanced Trench Isolation Applications", Semiconductor Fabtech, 9th Ed, pp. 241-247, pre-Jul. 2003.

Gasser et al., "Quasi-monolayer deposition of silicond dioxide", 250 Thin Solid Films, pp. 213-218, 1994.

George et al., "Atomic layer controlled deposition of SiO2 and Al2O3 using ABAB . . . binary reaction sequence chemistry", 82/83 Applied Surface Science, pp. 460-467, 1994.

Hausmann et al., "Catalytic vapor deposition of highly conformal silica nanolaminates", Dept. of Chemistry and Chemical Biology, Harvard University, pp. 1-13, May 14, 2002.

Hausmann et al., "Rapid Vapor Deposition of Highly Conformal Silica Nanolaminates", 298 Science, pp. 402-406, Oct. 11, 2002.

Horie et al., Kinetics and Mechanism of the Reactions of O(3P) with SiH4, CH3SiH3, (CH3)2SiH2, and (CH3)3SiH, 95 J. Phys. Chem., pp. 4393-4400, 1991.

Joshi et al., "Plasma Deposited Organosilicon Hydride Network Polymers as Versatile Resists for Entirely Dry Mid-Deep UV Photolithography", 1925 SPIE, pp. 709-720, 1993.

Kiermasz et al., "Planarization for Sub-Micron evices Utilizing a New Chemistry", 1-2 Electrotech, DUMIC Conference, California, Feb. 1995.

Klaus et al., "Atomic Layer Deposition of SiO2 Using Catalyzed and Uncatalyzed Self-Limiting Surface Reactions", 6 Surface Review and Letters, Nos. 3 & 4, pp. 435-448, 1999.

Kojima et al., "Planarization Process Using a Multi-Coating of Spin-on-Glass", V-MIC Conference, California, 2 pages, 1995.

Matsuura et al., "A Highly Reliable Self-planarizing Low-k Intermetal Dielectric for Sub-quarter Micron Interconnects", IEEE, pp. 785-788, 1997.

Matsuura et al., "Novel Self-planarizing CVD Oxide for Interlayer Dielectric Applications", IEEE, pp. 117-120, 1994.

McClatchie et al., "Low Dielectric Constant FlowfillTM Technology for IMD Applications", 7 pp. (pre-Aug. 1999).

Miller et al., "Self-limiting chemical vapor deposition of an ultra-thin silicon oxide film using tri-(tert-butoxy)silanol", 397 Thin Solid Films, pp. 78-82 (2001).

Morishita et al., "Atomic-layer chemical-vapor-deposition of silicon-nitride", 112 Applied Surface Science, pp. 189-204 (1997).

Nishiyama et al., "Agglomeration Resistant Self-Aligned Silicide Process Using N2 Implantation into TiSs2", 36 Jpn. J. Appl. Phys., Part 1, No. 6a, pp. 3639-3643 (Jun. 1997).

Shareef et al., "Subatmospheric chemical vapor deposition ozone/TEOS process for SiO2 trench filling", J. Vac. Sci. Technol. B 13(4), pp. 1888-1995 (Jul./Aug. 1995).

Withnall et al., "Matrix Reactions of Methylsilanes and Oxygen Atoms", 92 J. Phys. Chem. pp. 594-602, 1988.

Wolf, "Chapter 13: Polycides and Salicides of TiSix, CoSi2, and NiSi", Silicon Processing for the VLSI Era, vol. IV, pp. 603-604 (pre-2003).

Yokoyama et al., "Atomic layer controlled deposition of silicon nitride and in situ growth observation by infrared reflection absorption spectroscopy", 112 Applied Surface Science, pp. 75-81 (1997).

* cited by examiner

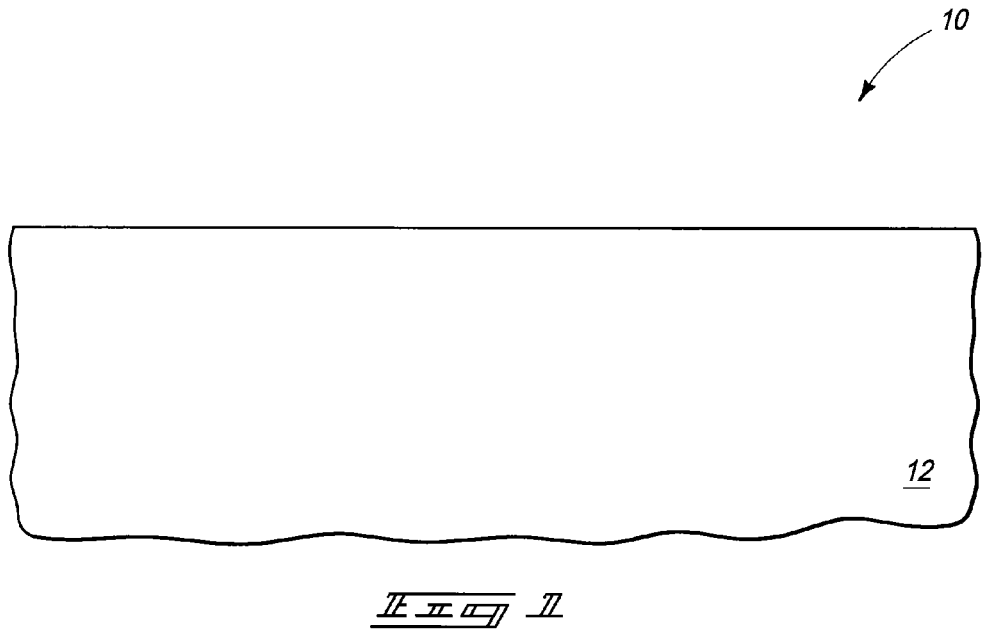
_Fig. 1_
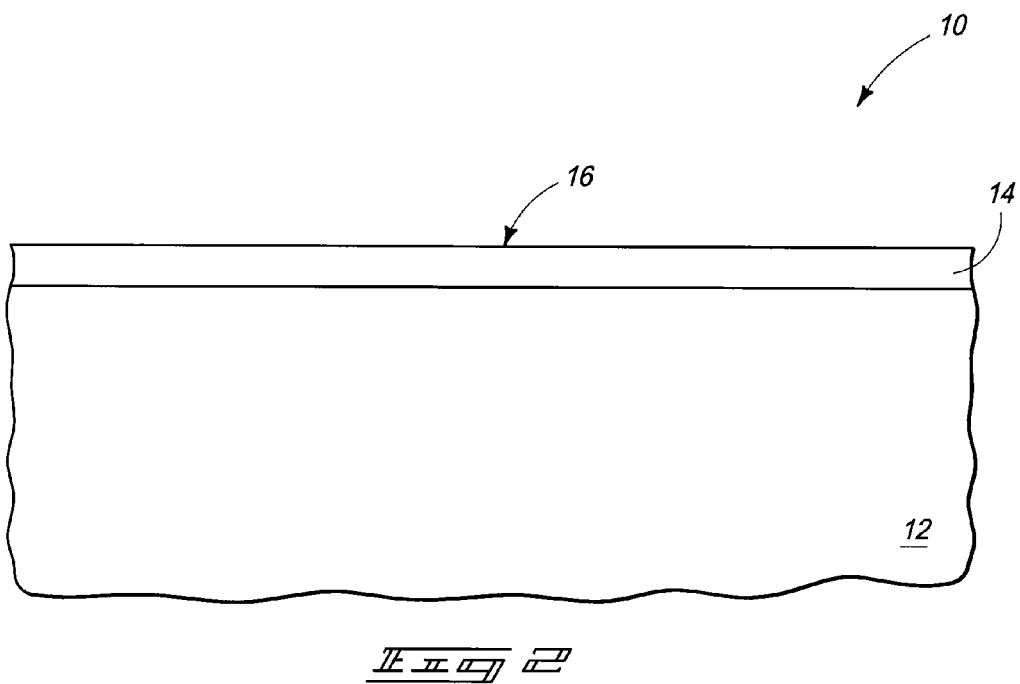
_Fig. 2_

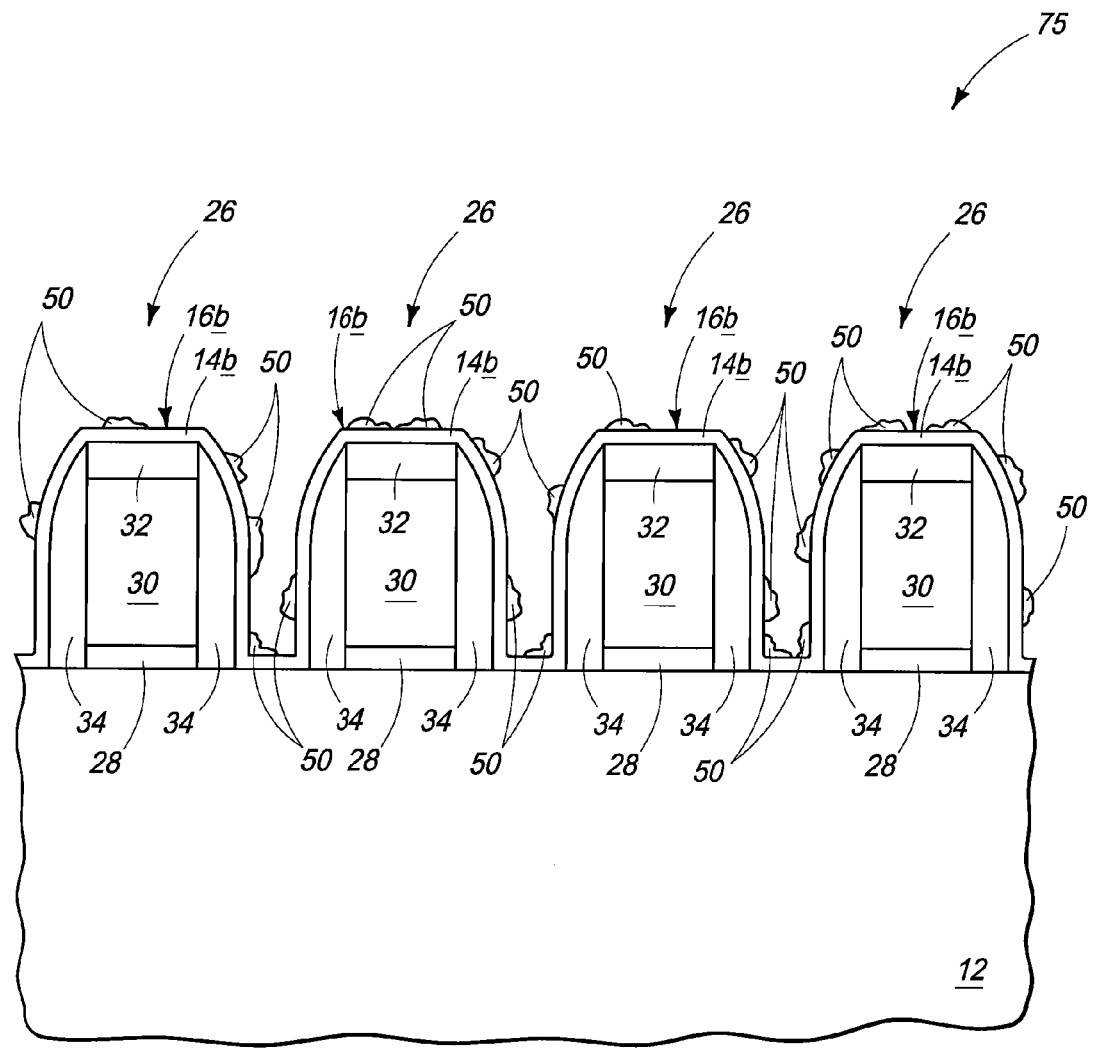
F I G  13

METHODS OF FORMING SILICON OXIDES AND METHODS OF FORMING INTERLEVEL DIELECTRICS

TECHNICAL FIELD

Embodiments disclosed herein pertain to methods of forming silicon oxides and to methods of forming interlevel dielectrics.

BACKGROUND

In the fabrication of integrated circuitry, numerous devices are packed into small areas of a semiconductor substrate and interconnected to create an integrated circuit. Many of the individual devices are electrically isolated from one another. Accordingly, electrical isolation is an integral part of semiconductor device design for preventing unwanted electrical coupling between the adjacent components and devices. For example, interlayer/interlevel dielectric layers isolate structures from metal interconnect layers. Such may be required to fill very narrow gaps between adjacent structures, for example gaps which have high aspect ratios (ratio of depth to average width) where the features are also spaced close together. Insulative structures such as shallow trench isolation regions are also formed in recesses (trenches) within substrate material between components.

Common electrical isolation/insulative materials include doped and undoped silicon oxide-comprising materials. Silicon oxide-comprising dielectric materials may be deposited in a number of different manners, including chemical vapor deposition and plasma enhanced chemical vapor deposition. With the increase in aspect ratio between adjacent features, use of flowable materials such as spin-on dielectrics is increasing due to greater gap filling capability than from chemical vapor deposition methods. Such flowable processes include applying a liquid precursor solution of a silicon-containing polymer onto a spinning substrate. The substrate is then baked to remove solvent from the liquid, and thereby form an adhesive solid onto the substrate. Thereafter, the substrate is subjected to a thermal oxidizing ambient sufficient to oxidize the solid into the desired silicon oxide-comprising material.

One type of spin-on dielectric uses one or more polysilazanes as a starting precursor. Oxidation of polysilazane-containing spin-on dielectrics typically requires an underlying silicon dioxide layer deposited by decomposition of tetraethylorthosilicate (TEOS), particularly where such spin-on dielectrics are deposited into openings having high aspect ratios and closely spaced features (i.e., less than 75 nanometers. TEOS-deposited silicon dioxide facilitates oxidation of the lower/innermost portions of the polysilazane(s) within deep/high aspect ratio openings where the oxidizing ambient may not reach.

The TEOS-deposited silicon dioxide is typically deposited onto a silicon nitride layer which functions as a diffusion barrier. As spaced adjacent features continue to be moved closer together, it is becoming increasingly difficult to get both sufficiently thick TEOS-silicon dioxide layers and silicon nitride layers in between adjacent features to provide their respective functions. Elimination or thinning of the TEOS layer alone has been determined to provide inadequate complete oxidation of densified polysilazane-comprising spin-on dielectrics between very closely spaced adjacent features. Such can ultimately lead to shorts between contacts formed within openings of the resulting silicon oxide-comprising interlayer dielectrics. Accordingly, a need remains to address such issues.

While the invention was motivated from the above-identified challenges, the invention is in no way so limited in overcoming or addressing such challenges. Rather, the invention is only limited by the accompanying claims as literally worded and as appropriately interpreted in accordance with the doctrine of equivalents.

BRIEF DESCRIPTION OF THE DRAWINGS

FIG. 1 is a diagrammatic sectional view of a substrate fragment in process in accordance with embodiments of the invention.

FIG. 2 is a view of the FIG. 1 substrate at a processing step subsequent to that shown by FIG. 1.

FIG. 13 is a diagrammatic sectional view of another substrate fragment in process in accordance with embodiments of the invention.

DETAILED DESCRIPTION OF EXAMPLE EMBODIMENTS

Figure 3:
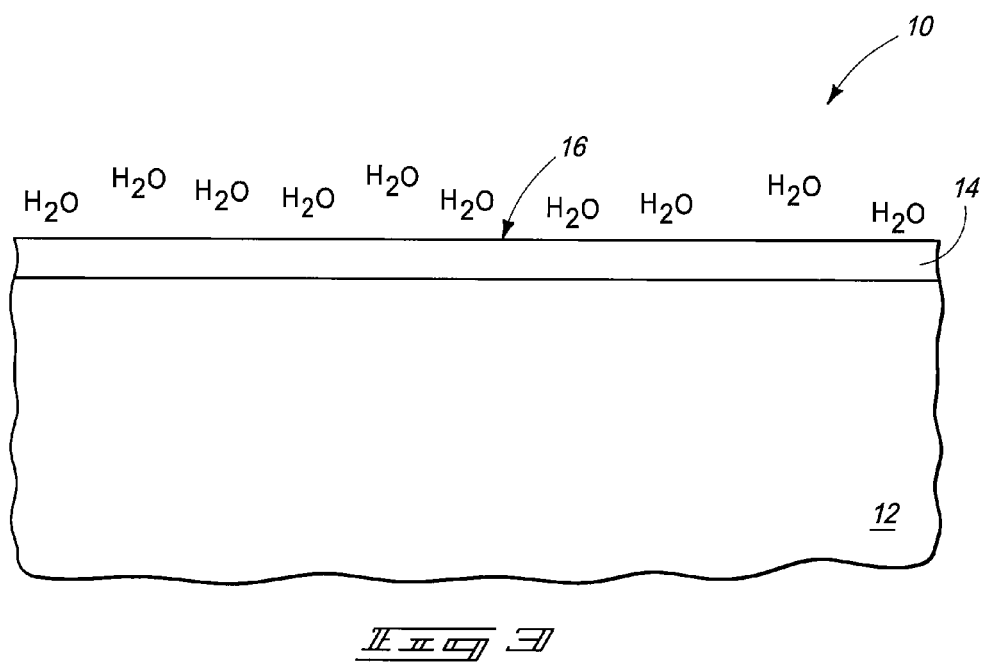
FIG. 3 is a view of the FIG. 2 substrate at a processing step subsequent to that shown by FIG. 2.

Some embodiments of methods of forming silicon oxide in accordance with the invention are initially described with reference to FIGS. 1-5 with respect to a substrate fragment 10. Referring to FIG. 1, substrate fragment 10 comprises substrate material 12, and may comprise a semiconductor or other substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Example substrate 10 is shown as having a planar outermost surface, although such need not be so. Further although material 12 of substrate 10 may constitute a single homogenous composition, it may also comprise numerous layers and/or regions of integrated circuitry at various processing stages, and regardless, include multiple different composition materials and regions.

Referring to FIG. 2, a silicon nitride-comprising material 14 has been deposited over substrate 12. Such may be continuous, for example in the form of a blanketing layer as shown, or may be discontinuous. Such may be deposited by any existing or yet-to-be developed technique, and may be partially etched back or polished after deposition. Further, as examples, such may be lithographically or otherwise patterned, and/or comprise anisotropically etched spacers on sidewalls of other structures. Any selected thickness may be used. Regardless, silicon nitride-comprising material 14 may be considered as having an elevationally outermost silicon nitride-comprising surface 16 which may be continuous, discontinuous, planar and/or non-planar. Silicon nitride-comprising material 14 and surface 16 may or may not be stoichiometric silicon nitride ($Si_3N_4$).

Referring to FIG. 3, elevationally outermost silicon nitride-comprising surface 16 has been treated with a fluid that is at least 99.5% $H_2O$ by volume. In one embodiment, the fluid is at least 99.9% $H_2O$ by volume, and in one embodiment is at least 99.99% $H_2O$ by volume. The fluid may be liquid, vapor, or a combination thereof. In one embodiment, the fluid is liquid deionized $H_2O$. In the context of this document, deionized $H_2O$ includes any liquid $H_2O$ that has been treated to remove minerals by one or more existing or yet-to-be developed deionization methods, and includes by distillation.

Where liquid treating is used, such might include one or a combination of immersing substrate 10 with surface 16 within a bath of the treating liquid and/or spraying surface 16 with the treating liquid. An example liquid temperature range is from 10° C. to 100° C. during the treating, with about room ambient temperature and a temperature of at least about 30° C. during the treating being specific examples. Pressure may be subatmospheric, room ambient, or greater than atmospheric during the treating. An example fluid temperature where the treating fluid is vapor is 100° C. and greater, with 125° C. being a specific example. Regardless, an example treating time with the fluid is from about 60 seconds to about 500 seconds. Substrate temperature during the treating may or may not be controlled, and may or may not be at room temperature. Regardless in one embodiment where the treating fluid comprises vapor, such may condense to liquid to be received onto elevationally outermost silicon nitride-comprising surface 16. In the context of this document, "onto" requires at least some direct physical touching contact of the two stated materials or layers.

Figure 4:
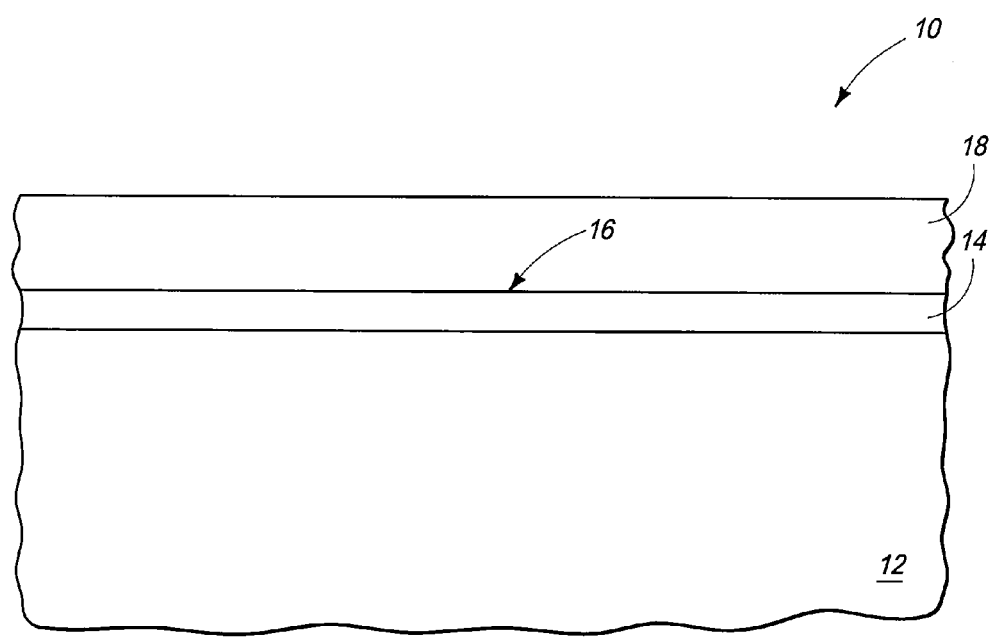
FIG. 4 is a view of the FIG. 3 substrate at a processing step subsequent to that shown by FIG. 3.

Referring to FIG. 4, a polysilazane-comprising spin-on-dielectric material 18 has been formed onto $H_2O$-treated silicon nitride-comprising surface 16. Polysilazanes contain $Si_xN_yH_z$-type units in which the Si atoms are in a "reducing environment" in —Si—NH-bonds. Examples of suitable polysilazanes include hexamethyldisilazane, tetramethyldisilazane, octamethylcyclotetrasilazane, hexamethylcyclotrisilazane, diethylaminotrimethylsilazane, dimethylaminotrimethylsilazane, perhydro-polysilazane, including any mixtures of these or other polysilazanes. Spinfil polysilazane spin-on dielectric materials available from AZ Electronic Materials of Japan are specific examples. Material 18 may be provided to any suitable thickness and by any suitable liquid spin-on deposition technique.

In one embodiment, treating of an elevationally outermost silicon nitride-comprising surface with a fluid that is at least 99.5% $H_2O$ by volume occurs in the spin-on-dielectric deposition chamber within which the polysilazane-comprising spin-on-dielectric material is deposited. In one embodiment, the substrate is not removed from the spin-on-dielectric deposition chamber between the treating with such fluid and the forming of the spin-on-dielectric thereon.

Figure 5:
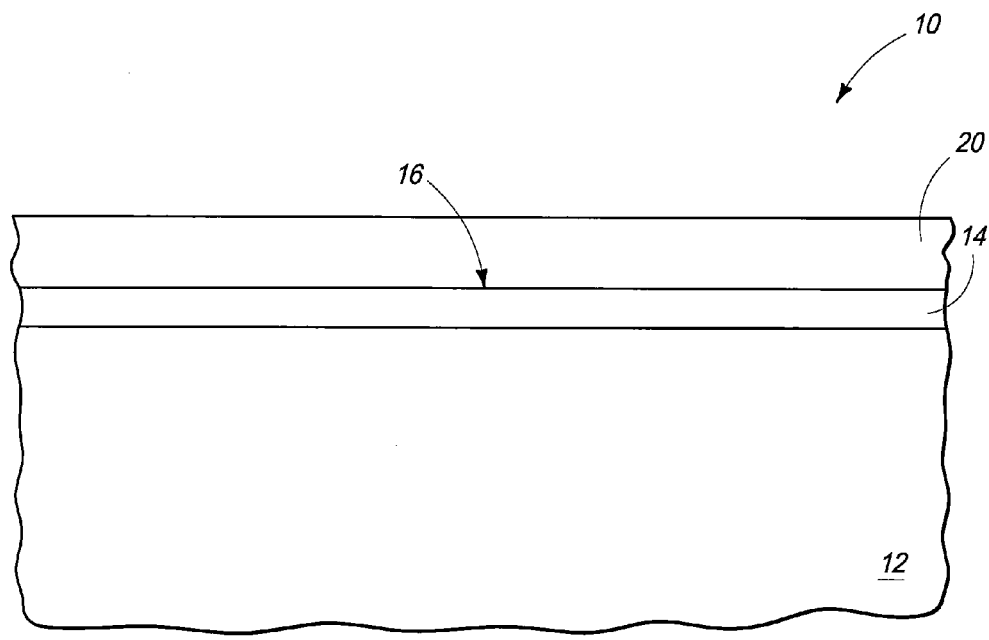
FIG. 5 is a view of the FIG. 4 substrate at a processing step subsequent to that shown by FIG. 4.

Referring to FIG. 5, polysilazane-comprising spin-on-dielectric material 18 (not shown) has been oxidized to form silicon oxide 20. Material 20 might include composition in addition to silicon oxide. Forming silicon oxide may include initially heating the substrate in the absence of an oxidizing ambient to remove organic solvent and produce a solid-phase polysilazane layer 18 (FIG. 4). For example, the initially deposited polysilazane material may be dried by baking on a hot plate at about 75° C. to about 350° C. for from about 1 to 5 minutes. The resultant layer may be subsequently subjected to wet or dry oxidation chemistries that will oxidize the polysilazane groups ($Si_xN_yH_z$) of the polysilazane material by replacing nitrogen and hydrogen atoms with oxygen atoms to form the layer into an oxygen rich material 20 (FIG. 5), i.e., a silicon oxide which may primarily be silicon dioxide. Example wet oxidation includes exposure to $H_2O$ at a temperature of at least 600° C.

Figure 6:
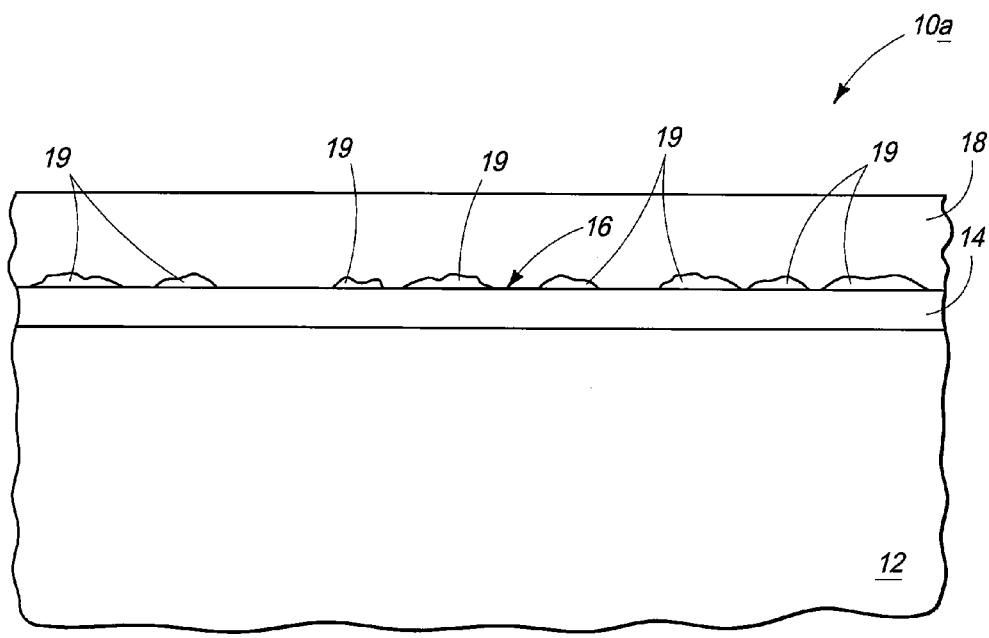
FIG. 6 is a diagrammatic sectional view of another substrate fragment in process in accordance with embodiments of the invention.

Some, all, or none of the $H_2O$ may remain atop surface 16 at the time of depositing the polysilazane-comprising spin-on dielectric material, with none being shown as being left in FIG. 4. By way of example, some or all of remaining $H_2O$ may be removed by exposure to isopropyl alcohol. Alternate drying techniques include spinning the substrate, exposure to reduced pressure/a vacuum, and air or other gas drying. FIG. 6 depicts an alternate embodiment substrate 10a to that shown by FIG. 4 wherein some liquid $H_2O$ 19 remains over surface 16 at the time of and upon depositing polysilazane-comprising spin-on dielectric material 18. Like numerals have been used with respect to the above-described embodiments, with differences being indicated with the suffix "a" or with different numerals. Accordingly in such embodiment, polysilazane-comprising material 18 deposits onto both $H_2O$ 19 and silicon nitride-comprising surface 16. Liquid $H_2O$ 19 onto which polysilazane-comprising spin-on dielectric material 18 is deposited may result from condensation of vapor $H_2O$.

Figure 7:
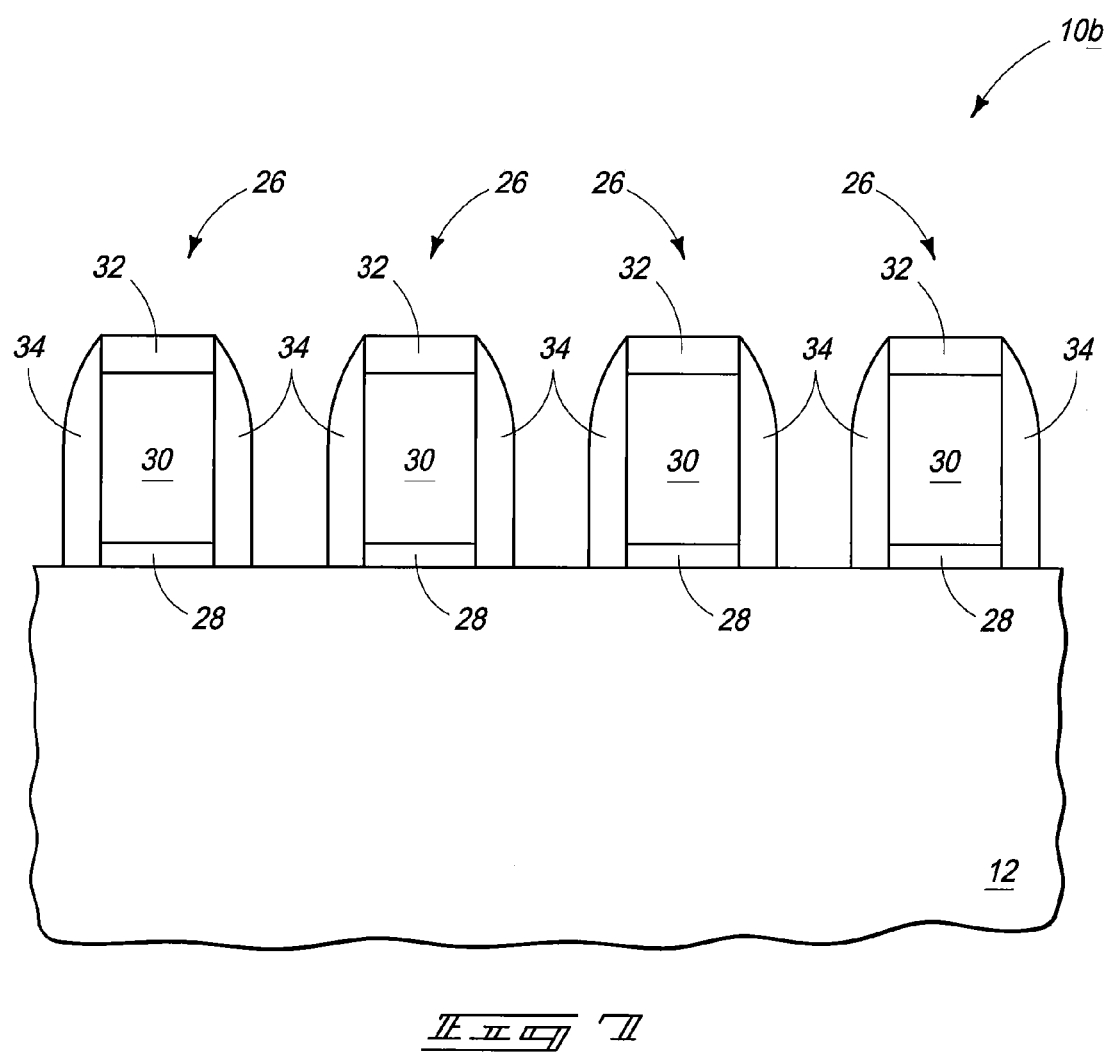
FIG. 7 is a diagrammatic sectional view of another substrate fragment in process in accordance with embodiments of the invention.

Additional embodiment methods of forming silicon oxide, and for example forming an interlevel dielectric layer, are next-described with reference to FIGS. 7-12 with respect to a substrate fragment 10b. Like numerals have been used with respect to the above-described embodiments, with differences being indicated with the suffix "b" or with different numerals. Referring to FIG. 7, raised features 26 have been formed over substrate 12. In one embodiment, raised features 26 comprise a plurality of upwardly projecting transistor gate structures. Transistor gate structures 26 are shown as comprising a gate dielectric 28, one or more conductive materials 30, an insulative cap 32, and anisotropically etched insulative sidewall spacers 34. Alternate transistor gate and/or other structures are also of course contemplated. Further and regardless, structures 26 need not be the same relative to one another.

In one embodiment in accordance with the tight spacing and high aspect ratio issues identified in the "Background" section above, raised features 26 are spaced from adjacent raised features by no greater than 75 nanometers, and wherein spaces between immediately adjacent raised features 26 have aspect ratios of at least 5:1. In one embodiment, line width of materials 28, 30 and 32 averages about 40 nanometers and space between adjacent spacers 34 averages about 40 nanometers. Example combined thickness of materials 28, 30, and 32 may be about 2,400 Angstroms, thereby providing an aspect ratio of about 6:1. Higher and lower aspect ratios are contemplated. Spacers 34 are shown as comprising laterally outer vertical sidewalls extending upwardly from material 12. Such may not so vertically extend, and may angle upwardly and laterally outward from material 12. Regardless, "aspect ratio" as used herein is with respect to height divided by average width.

Figure 8:
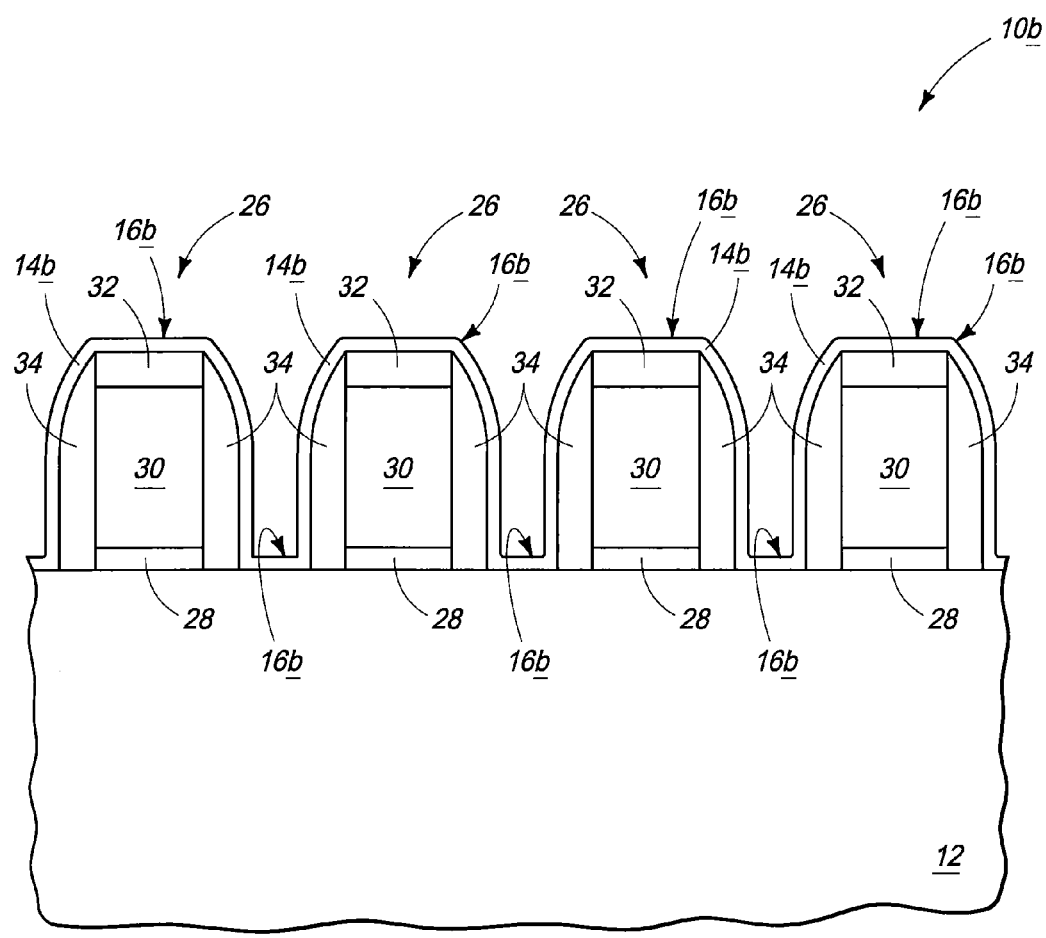
FIG. 8 is a view of the FIG. 7 substrate at a processing step subsequent to that shown by FIG. 7.

Referring to FIG. 8, silicon nitride-comprising material 14b has been deposited over the substrate having raised features 26. Silicon nitride-comprising material 14b has a non-planar elevationally outermost silicon nitride-comprising surface 16b, and less than fills space between adjacent of raised features 26.

Figure 9:
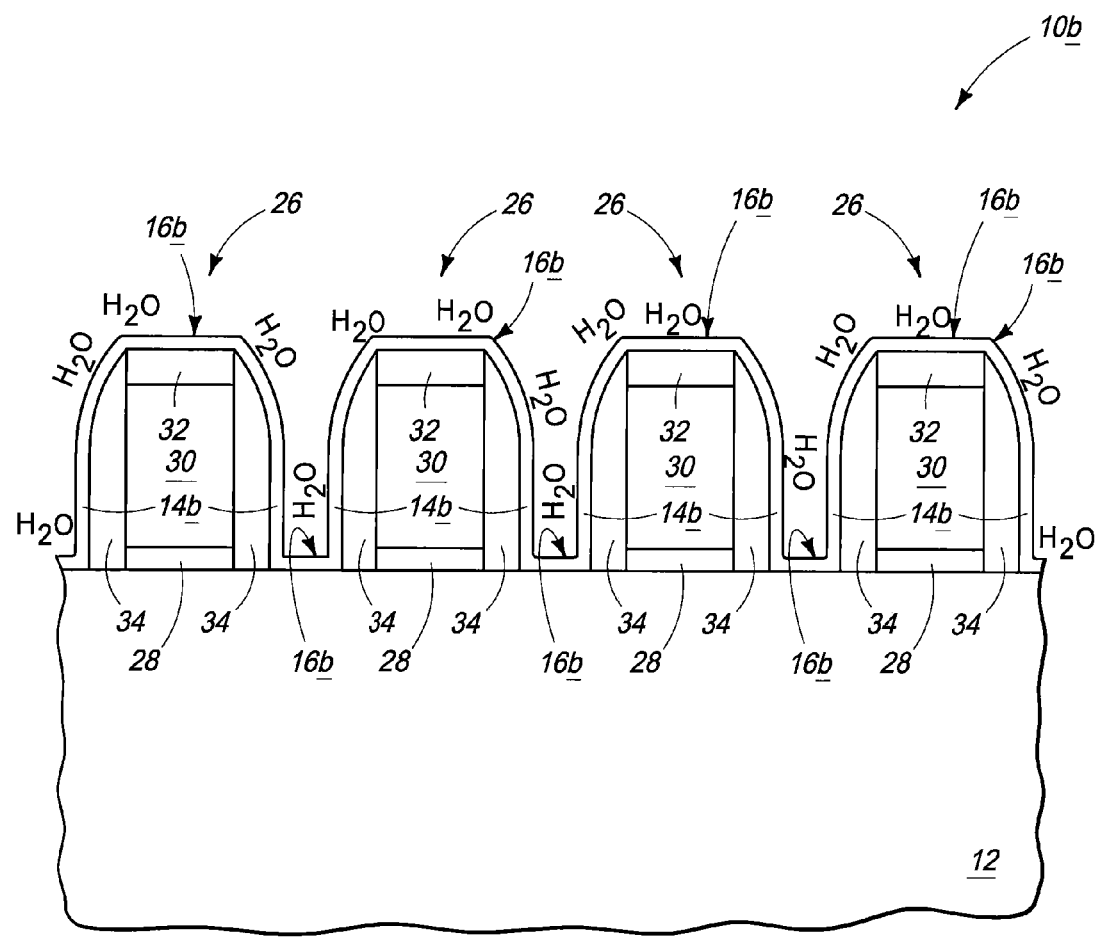
FIG. 9 is a view of the FIG. 8 substrate at a processing step subsequent to that shown by FIG. 8.

Referring to FIG. 9, elevationally outermost silicon nitride-comprising surface 16b above and between adjacent of raised features 26 is treated with a fluid that is at least 99.5% $H_2O$ by volume. Any of the treatment techniques and fluids described above may be used.

Figure 10:
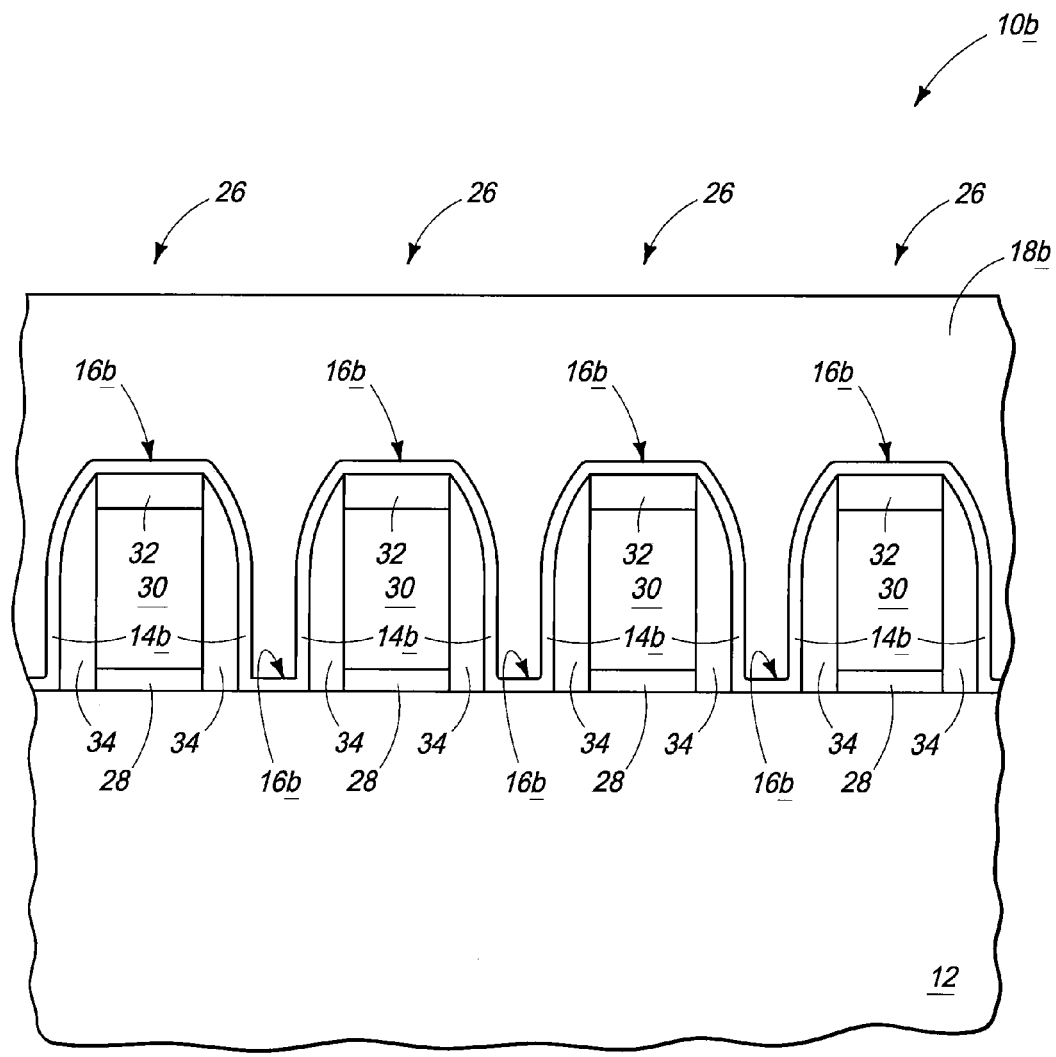
FIG. 10 is a view of the FIG. 9 substrate at a processing step subsequent to that shown by FIG. 9.
Figure 11:
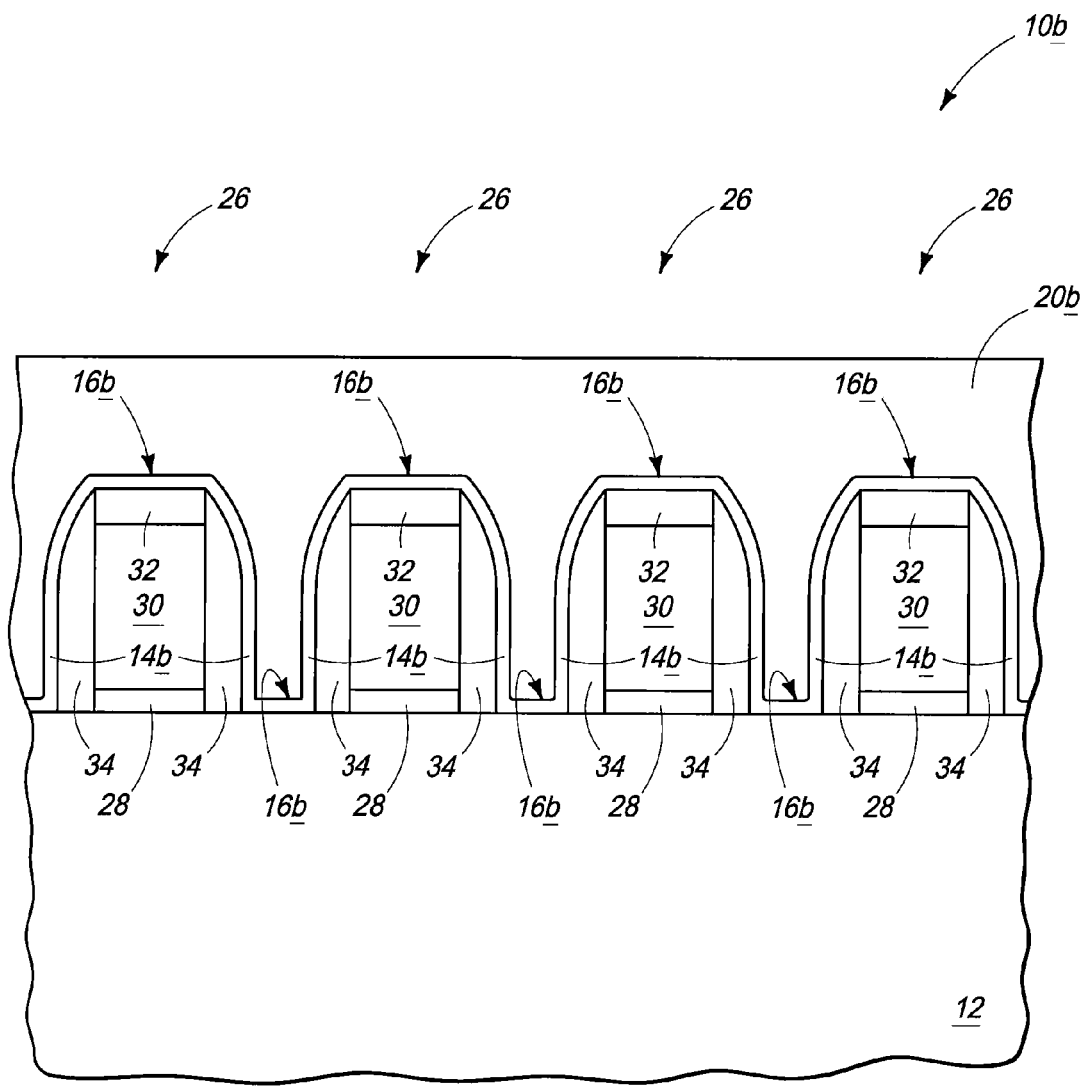
FIG. 11 is a view of the FIG. 10 substrate at a processing step subsequent to that shown by FIG. 10

Referring to FIG. 10, a polysilazane-comprising spin-on-dielectric material 18b has been formed onto $H_2O$-treated silicon nitride-comprising surface 16b. Such is oxidized to form silicon oxide 20b, for example as shown in FIG. 11. Any of the processing as described above may be used.

Figure 12:
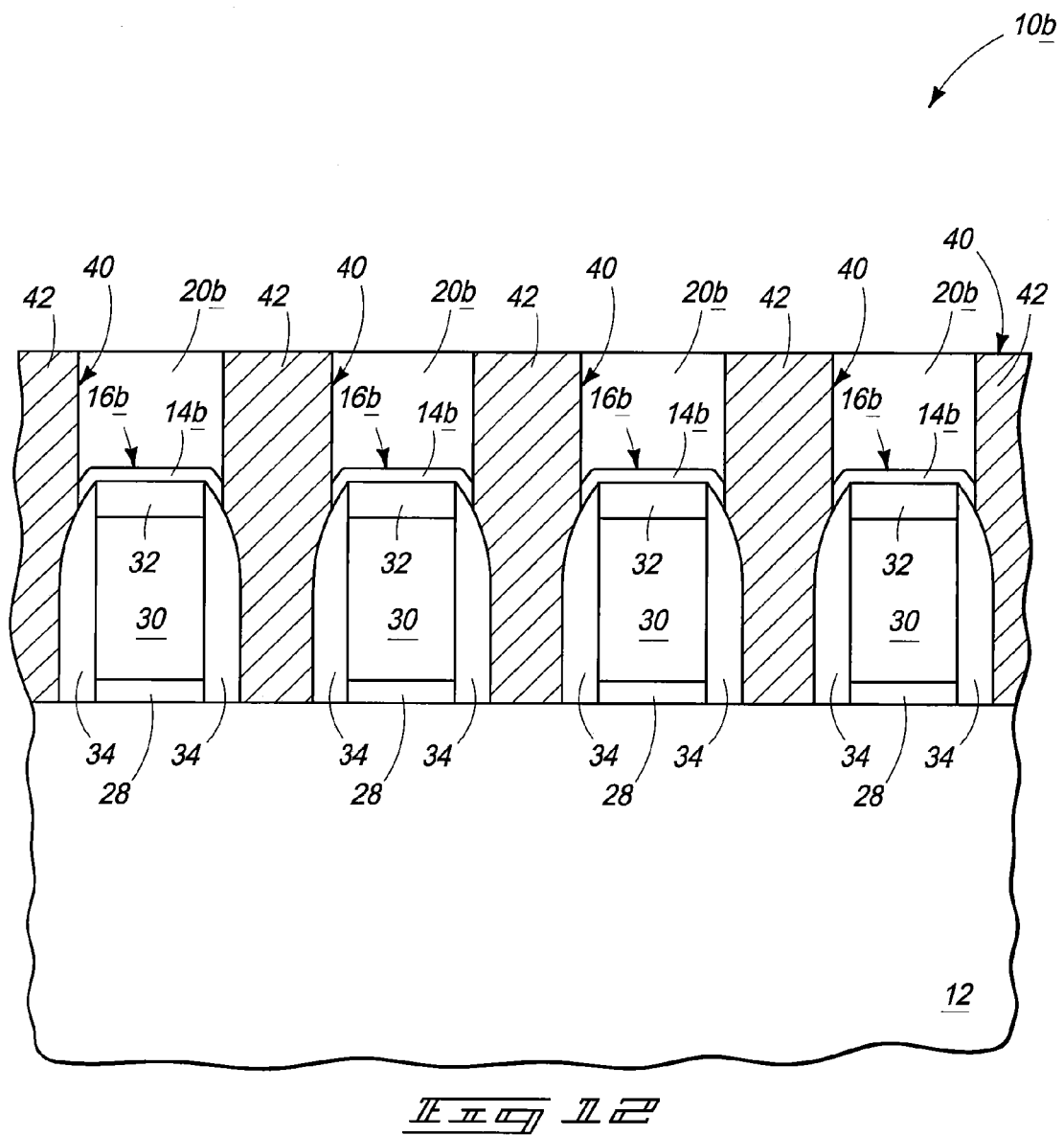
FIG. 12 is a view of the FIG. 11 substrate at a processing step subsequent to that shown by FIG. 11.

Referring to FIG. 12, subsequent processing is depicted wherein contact openings 40 have been formed through silicon oxide 20b and silicon nitride-comprising material 14b to substrate material 12 therebeneath. One or more conductive materials 42 have been formed in contact openings 40. Conductive material 42 may comprise one or more of conductively doped semiconductive material (i.e., conductively doped polysilicon) or metal. Silicon oxide material 20b may be deposited to a greater thickness than shown, followed by polish or etch back thereby forming an interlevel dielectric layer prior to etch and fill of contact openings 40 with conductive material 42.

The above processing enables elimination of deposition of a silicon dioxide layer by decomposition of tetraethylorthosilicate over silicon nitride-comprising material 14b prior to deposition of polysilazane-comprising spin-on-dielectric material 18b. Such may enable somewhat thicker deposition of a silicon nitride-comprising layer, for example to a thickness of at least 80 Angstroms for better oxidation barrier function in comparison with the typical prior art deposition thickness range of from 40 Angstroms to 70 Angstroms for features spaced about 40 nanometers apart. Prior art silicon dioxide layers for such spacing had thickness of from 100 Angstroms to 125 Angstroms. Accordingly, silicon oxide layer elimination may enable silicon nitride thicknesses on the order of 140 Angstroms to 195 Angstroms. Further and regardless, some, all, or none of the treating $H_2O$ may remain over silicon nitride-comprising surface 16b at the time of deposition of polysilazane-comprising spin-on-dielectric material 18b.

Example methods of forming silicon oxide are next described with reference to FIGS. 13-15 with respect to a substrate fragment 75. Referring to FIG. 13, liquid $H_2O$ 50 has been provided onto elevationally outermost silicon nitride-comprising surface 16c. Such may be provided by one or both of direct exposure to liquid or by condensation from $H_2O$-containing vapor. In one embodiment, liquid $H_2O$ 50 comprises at least 99.0% $H_2O$ by volume. Higher concentration $H_2O$ by volume is also contemplated, for example as described in any of the embodiments with respect to FIGS. 1-12. Polysilazane-comprising spin-on dielectric material would subsequently be formed onto the liquid $H_2O$ and onto the silicon nitride-comprising surface. Such polysilazane-comprising spin-on-dielectric is ultimately oxidized to form silicon oxide. Any processing as described above may be used.

Figure 14:
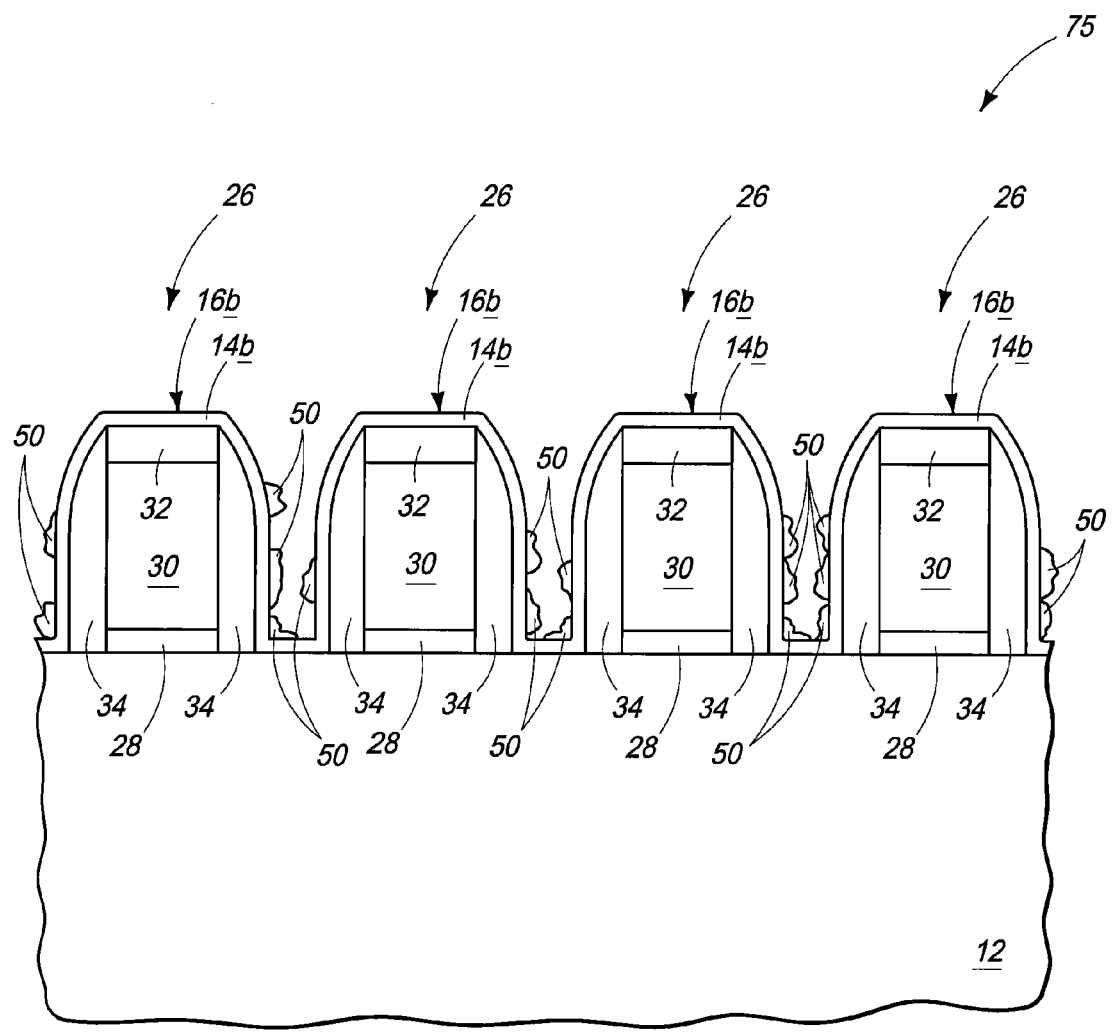
FIG. 14 is a view of the FIG. 13 substrate at a processing step subsequent to that shown by FIG. 13.

In one embodiment, the $H_2O$ is removed from being received over tops of the raised features while leaving liquid $H_2O$ contacting on portions of the silicon nitride-comprising surface between adjacent of the raised features, for example as shown in FIG. 14. Such may, for example be accomplished by exposing the FIG. 13 substrate to isopropyl alcohol, for example by a bath dip or spraying. Such may, by way of example only, be sufficient to remove $H_2O$ liquid 50 from over tops of raised structures 26 but insufficient to remove liquid $H_2O$ 50 received within deep narrow openings between raised structures 26. Regardless, one embodiment of the invention contemplates exposing the silicon nitride-comprising material to isopropyl alcohol before deposition of a polysilazane-comprising spin-on-dielectric material regardless of whether such removes some of the liquid $H_2O$. In one embodiment, exposure to isopropyl alcohol removes some and only some of the liquid $H_2O$ from the silicon nitride-comprising surface. Alternate drying techniques include spinning, exposure to reduced pressure/a vacuum, and air or other gas drying.

Figure 15:
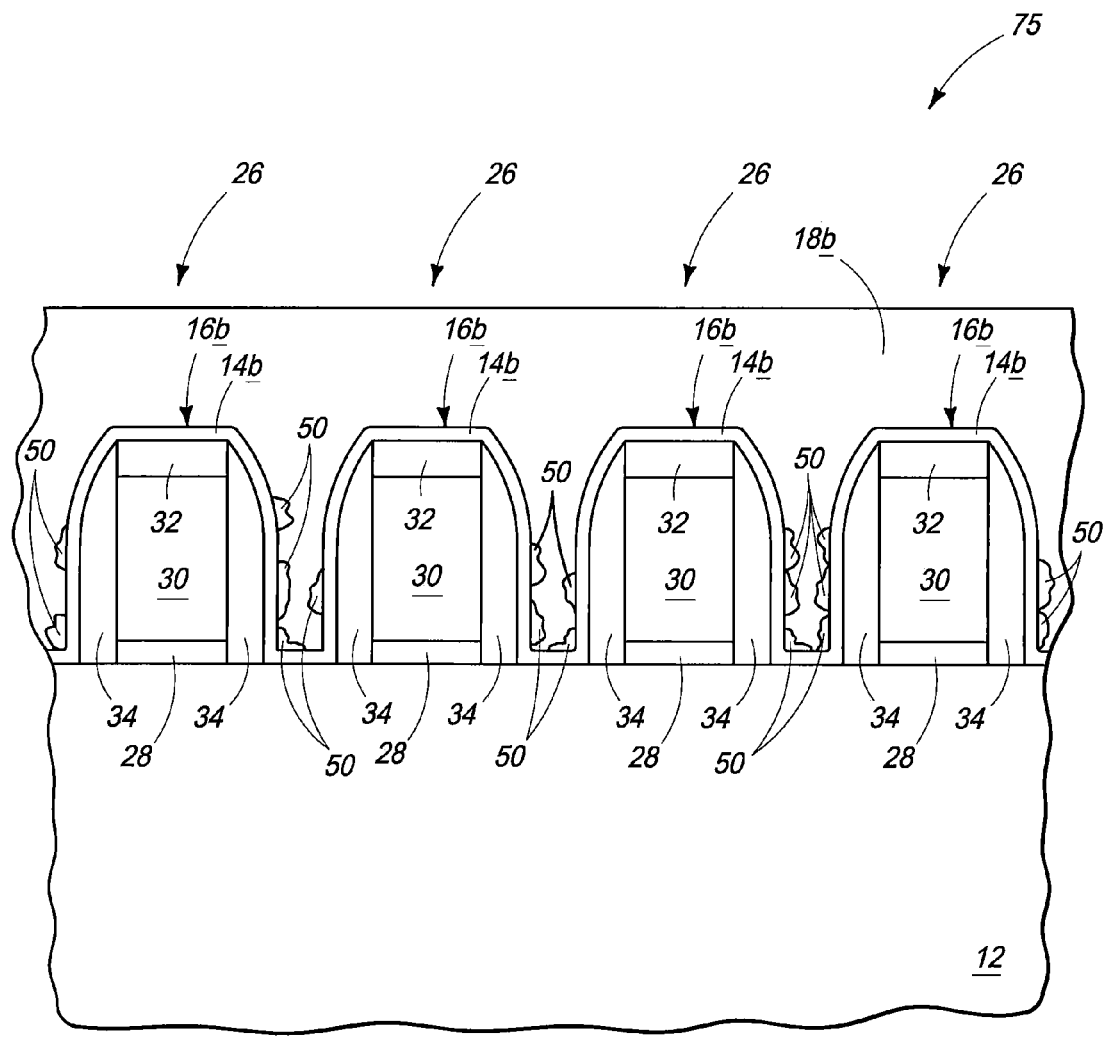
FIG. 15 is a view of the FIG. 14 substrate at a processing step subsequent to that shown by FIG. 14.

Referring to FIG. 15, polysilazane-comprising spin-on-dielectric material 18b has been deposited onto liquid $H_2O$ 50 and onto silicon nitride-comprising surface 16b. Such would be subsequently oxidized to form silicon oxide.

The embodiments of FIGS. 7-15 might form outermost surfaces of one or both of spacers 34 and caps 32 to comprise silicon nitride. If so, silicon nitride-comprising material 14b might be eliminated, with processing otherwise occurring as indicated above, or otherwise. Such may be desirable for very high aspect ratio openings and very close spacing between immediately adjacent features 26 that may not provide sufficient open space for material 14b.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming silicon oxide, comprising:
depositing a silicon nitride-comprising material over a substrate, the silicon nitride-comprising material having an elevationally outermost silicon nitride-comprising surface;
treating the elevationally outermost silicon nitride-comprising surface with a liquid that is at least 99.5% deionized $H_2O$ by volume;
forming a polysilazane-comprising spin-on dielectric material onto the deionized $H_2O$-treated silicon nitride-comprising surface; and
oxidizing the polysilazane-comprising spin-on dielectric material to form silicon oxide.

2. The method of claim 1 wherein the liquid is at least 99.9% deionized $H_2O$ by volume.

3. The method of claim 1 wherein the liquid is at least 99.99% deionized $H_2O$ by volume.

4. The method of claim 1 wherein the treating comprises immersing the silicon nitride-comprising surface within a bath of the liquid.

5. The method of claim 1 wherein the treating comprises spraying the silicon nitride-comprising surface with the liquid.

6. The method of claim 1 wherein the liquid is from 10° C. to 100° C. during the treating.

7. The method of claim 6 wherein the liquid is at about ambient room temperature during the treating.

8. The method of claim 6 wherein the liquid is at a temperature of at least about 30° C. during the treating.

9. The method of claim 1 wherein the liquid is at ambient room pressure during the treating.

10. The method of claim 1 wherein the treating is from about 60 seconds to about 500 seconds.

11. A method of forming silicon oxide, comprising:
depositing a silicon nitride-comprising material over a substrate, the silicon nitride-comprising material having an elevationally outermost silicon nitride-comprising surface;
treating the elevationally outermost silicon nitride-comprising surface with a vapor that is at least 99.5% $H_2O$ by volume;
forming a polysilazane-comprising spin-on dielectric material onto the $H_2O$-treated silicon nitride-comprising surface; and
oxidizing the polysilazane-comprising spin-on dielectric material to form silicon oxide.

12. The method of claim 11 wherein the vapor is at least 99.9% $H_2O$ by volume.

13. The method of claim 11 wherein the vapor is at least 99.99% $H_2O$ by volume.

14. The method of claim 11 comprising condensing the vapor to liquid and onto the elevationally outermost silicon nitride-comprising surface.

15. The method of claim 14 comprising forming the polysilazane-comprising spin-on dielectric material onto the condensed liquid.

16. A method of forming silicon oxide, comprising:
forming raised features over a substrate;
depositing a silicon nitride-comprising material over the substrate having the raised features, the silicon nitride-comprising material having a non-planar elevationally outermost silicon nitride-comprising surface and less than filling space between adjacent of the raised features;
providing liquid $H_2O$ onto the elevationally outermost silicon nitride-comprising surface;
forming a polysilazane-comprising spin-on dielectric material onto the liquid $H_2O$ and onto the silicon nitride-comprising surface; and
oxidizing the polysilazane-comprising spin-on dielectric material to form silicon oxide.

17. The method of claim 16 comprising exposing the silicon nitride-comprising material to isopropyl alcohol after the providing and before the forming.

18. The method of claim 17 wherein the exposing removes some and only some of the liquid $H_2O$ from the silicon nitride-comprising surface.

19. The method of claim 16 comprising, after the providing and before the forming, removing the liquid $H_2O$ from being received over tops of the raised features while leaving liquid $H_2O$ contacting on portions of the silicon nitride-comprising surface between adjacent of the raised features, the polysilazane-comprising spin-on dielectric material being formed onto said portions.

20. The method of claim 19 wherein the removing comprises exposure to isopropyl alcohol.

21. The method of claim 16 wherein the liquid $H_2O$ comprises at least 99.0% $H_2O$ by volume.

22. The method of claim 16 wherein the liquid $H_2O$ comprises at least 99.5% $H_2O$ by volume.

23. The method of claim 16 wherein the liquid $H_2O$ comprises at least 99.99% $H_2O$ by volume.

24. The method of claim 16,
being void of depositing a silicon dioxide layer by decomposition of tetraethylorthosilicate between the forming of the raised features and the depositing of the silicon nitride-comprising material;
wherein the raised features are spaced from adjacent raised features by no greater than 75 nanometers;
wherein spaces between the raised features have aspect ratio of at least 5:1; and
wherein the deposited silicon nitride-comprising material is a layer having a thickness of at least 80 Angstroms.

25. A method of forming an interlevel dielectric layer comprising silicon oxide in the fabrication of integrated circuitry, comprising:
forming a plurality of upwardly projecting transistor gate structures over a substrate;
depositing a silicon nitride-comprising material over and between the upwardly projecting transistor gate structures, the silicon nitride-comprising material having a nonplanar elevationally outermost silicon nitride-comprising surface and less than filling space between adjacent of the upwardly projecting transistor gate structures;
treating the elevationally outermost silicon nitride-comprising surface above and between adjacent of the upwardly projecting transistor gate structures with a fluid that is at least 99.5% $H_2O$ by volume;
forming a polysilazane-comprising spin-on dielectric material onto the $H_2O$-treated silicon nitride-comprising surface; and
oxidizing the polysilazane-comprising spin-on dielectric material to form silicon oxide.

26. The method of claim 25 wherein the fluid comprises liquid.

27. The method of claim 26 comprising forming the polysilazane-comprising spin-on dielectric material onto the liquid.

28. The method of claim 25 wherein the fluid comprises vapor.

29. The method of claim 28 comprising condensing the vapor to liquid and onto the elevationally outermost silicon nitride-comprising surface.

30. The method of claim 29 comprising forming the polysilazane-comprising spin-on dielectric material onto the condensed liquid.

31. The method of claim 25 wherein the fluid comprises at least 99.9% $H_2O$ by volume.

32. The method of claim 25 wherein the fluid comprises at least 99.99% $H_2O$ by volume.

33. The method of claim 25 being void of depositing a silicon dioxide layer by decomposition of tetraethylorthosilicate between the forming of the transistor gate structures and the depositing of the silicon nitride-comprising material.

34. A method of forming silicon oxide, comprising:
depositing a silicon nitride-comprising material over a substrate, the silicon nitride-comprising material having an elevationally outermost silicon nitride-comprising surface;

providing the substrate with silicon nitride-comprising material within a spin-on dielectric deposition chamber;

within the spin-on dielectric deposition chamber, treating the elevationally outermost silicon nitride-comprising surface with a fluid that is at least 99.5% $H_2O$ by volume;

within the spin-on dielectric deposition chamber, forming a polysilazane-comprising spin-on dielectric material onto the $H_2O$-treated silicon nitride-comprising surface; and oxidizing the polysilazane-comprising spin-on dielectric material to form silicon oxide.

35. The method of claim 34 wherein the substrate is not removed from the spin-on dielectric deposition chamber between the treating and the forming.

36. A method of forming silicon oxide, comprising:

depositing a silicon nitride-comprising material over a substrate, the silicon nitride-comprising material having an elevationally outermost silicon nitride-comprising surface;

treating the elevationally outermost silicon nitride-comprising surface with a fluid that is at least 99.5% deionized $H_2O$ by volume;

forming a polysilazane-comprising spin-on dielectric material onto the deionized $H_2O$-treated silicon nitride-comprising surface; and oxidizing the polysilazane-comprising spin-on dielectric material to form silicon oxide.

* * * * *